United States Patent [19]

Takashima

[11] Patent Number: 5,180,991

[45] Date of Patent: Jan. 19, 1993

[54] FREQUENCY ADJUSTABLE RC OSCILLATOR

[75] Inventor: Sumihiro Takashima, Tokyo, Japan

[73] Assignee: Oki Electric Industry Co., Ltd., Tokyo, Japan

[21] Appl. No.: 743,813

[22] Filed: Aug. 12, 1991

[30] Foreign Application Priority Data

Aug. 14, 1990 [JP] Japan .................................. 2-213773

[51] Int. Cl.[5] .......................... H03B 5/20; H03L 7/00
[52] U.S. Cl. .................................... 331/1 A; 331/49; 331/57; 331/135; 331/143; 331/179
[58] Field of Search .................... 331/111, 113 R, 143, 331/144, 135, 136, 137, 179, 57, 1 R, 1 A

[56] References Cited

U.S. PATENT DOCUMENTS 4,156,205  5/1979  Kadin et al. ...................... 331/179 X
5,053,723  10/1991  Schemmel ........................ 331/179 X

*Primary Examiner*—Siegfried H. Grimm
*Attorney, Agent, or Firm*—Edward D. Manzo

[57] ABSTRACT

An RC oscillator for varying an oscillation frequency which has a counter for counting a clock pulse of the oscillation frequency and for outputting a counted value in a form of a plurality of bits to an output terminal. It also includes a standard capacitor, a plurality of capacitors having a capacitance value in proportion to a weight of bits outputted from the counter, and a plurality of switches connected to one end of each capacitor for selectively connecting the capacitors in parallel. A plurality of first gate circuits control the switches connected thereto in response to an output of the counter, each first gate circuit has an input terminal connected to an output terminal of the counter and an output terminal connected to a control terminal of the switches. A second gate circuit turns on the switches independently of the output of the counter in the case of a frequency adjustment of the oscillation signal, the second gate circuit has an input terminal connected to a predetermined output terminal of the counter and an output terminal connected to a switch for use of the standard capacitor.

17 Claims, 3 Drawing Sheets

FREQUENCY ADJUSTABLE RC OSCILLATOR

REFERENCE RELATED TO APPLICATION

This application claims the right to priority under 35 U.S.C. §119, of Japanese Application Serial No. 02-213773, filed on Aug. 14, 1990, the entire disclosure of which is incorporated herein by reference.

FIELD OF THE INVENTION

The present invention relates to an RC oscillator, and more particularly to a frequency adjustable RC oscillator.

BACKGROUND OF THE INVENTION

A crystal oscillation circuit is usually utilized as a clock signal source for an integrated circuit. The crystal oscillation circuit features high stability of frequency but difficulty in varying the frequency. Therefore, when a system requires a plurality of fundamental signal sources, the crystal oscillation circuit is often utilized as a high frequency clock signal source with high stability.

An RC oscillator comprises, in combination, capacitors, resistors, buffers and inverters. A plurality of inverters are connected in series, and both resistors and capacitors are connected in parallel to the inverters. An oscillation frequency f of the RC oscillator is determined by the values of these resistors and capacitors. When a threshold voltage $V_{th}$ of the transistors constituting the inverters and a source voltage $V_{DD}$ supplied to the transistors have the relation $V_{th} = \frac{1}{2} V_{DD}$, then the oscillation frequency f is described as $f = 1/2.2\ CR$.

If the foregoing RC oscillator is incorporated into an integrated circuit (IC), the oscillation frequency f may vary due to variations of inverter characteristics, resistor values and capacitor values depending on manufacturing conditions. In order to solve the above-problems, a frequency adjustable RC oscillator has been developed to absorb the variations of each element.

Some examples of conventional frequency adjustable RC oscillators are disclosed in Japanese Patent Laid-Open Publications No. 60-260213, 63-116505 and 63-114304, respectively. These RC oscillators employ a plurality of capacitors (C) which determine the oscillation frequency f. These respective capacitors (C), except for prescribed capacitors, are connected to the inverters via switches which are controlled by decoders. The decoders perform a drive control of the switches in accordance with data inputted therein. In other words, the conventional frequency adjustable RC oscillator adjusts the oscillation frequency f by varying the value of the capacitor connected in parallel to the inverters, which is performed by driving the switch in accordance with data inputted to a control terminal of the decoder.

Hereinafter, the operation of an RC oscillator will be explained in detail. The RC oscillator initially generates a higher frequency f than the target frequency $f_t$ by only a prescribed number of capacitors C being connected to the inverters.

Next, an operator adjusts the frequency by measuring the frequency f and varying the control data supplied to the control terminal of the decoder in accordance with a deviation between the measured frequency f and the target frequency $f_t$. The capacitor C which compensates for the deviation of the frequency f is connected via a switch in parallel to the inverters causing the oscillation frequency f to be adjusted to the target frequency $f_t$.

Then, the adjuster finalizes the frequency adjustment procedure by supplying the control data to the decoder.

The above described conventional technique, however, requires manual frequency adjustment by the adjuster for each of the respective integrated RC oscillation circuits. The adjuster must perform jobs, such as the measurement of the frequency, determination of input data to the decoder, and drive of the control terminal, independently, in accordance with each of integrated circuit devices. Therefore, the conventional frequency adjustment technique is time and cost consuming.

SUMMARY OF THE INVENTION

An object of the present invention is to provide a frequency adjustable RC oscillator which solves the foregoing shortcomings and eliminates a frequency adjustment procedure by an adjuster.

Another object of the present invention is to provide a frequency adjustable RC oscillator which can be adjusted to a predetermined frequency, automatically.

To accomplish the above objects, an RC oscillator for adjusting an oscillation frequency is disclosed which has a counter for counting a clock pulse of the oscillation frequency and for outputting a counted value in a form of plurality of bits to an output terminal. It also has a standard capacitor, a plurality of capacitors each having a capacitance value in proportion to a weight of the bits outputted from the counter, a plurality of switches connected to one end of each of the capacitors for selectively connecting the capacitors in parallel.

The RC oscillator also includes a plurality of first gate circuits for controlling the switches connected thereto in response to an output of the counter, each of the first gate circuits having an input terminal connected to an output terminal of the counter and an output terminal connected to a control terminal of the switches. A plurality of second gate circuits turn on the switches independently from the output of the counter in case of a frequency adjustment of the oscillation signal, each of the second gate circuits have an input terminal connected to a predetermined output terminal of the counter and an output terminal connected to a switch for use of the standard capacitor.

An RC oscillator according to the present invention first counts its oscillating clock signal to an accuracy within a period of a gate time. Then, capacitors are connected to inverters in proportion to the weight of each of the bits of the counter output after the gate time is completed so that the target frequency is automatically obtained. Therefore, the manufacturing cost can be greatly reduced by eliminating the adjuster's work of manual frequency adjustment.

Furthermore, according to the present invention, an oscillator having a predetermined resistance for generating an oscillator frequency comprises: a binary counter for detecting the oscillator frequency and outputting an n-bit binary signal corresponding to the detected oscillator frequency, wherein n is a natural number. The binary counter further has n output terminals that consist of a first output terminal to an n-th output terminal, an i-th output terminal outputting a first or second value corresponding to the i-th digit of the n-bit binary signal, wherein i is a natural number and not more than n. The oscillator also has n capacitors consisting of a first capacitor to an n-th capacitor, an i-th capacitor having the i-th capacitance $C_i$ determined by the equation $Ci=Cn/(2_{n-i})$ wherein Cn is the capacitance of the n-th capacitor; and n switching elements consisting of a first switching element to an n-th switching element, an i-th switching element coupling the i-th capacitor with said oscillator only upon the first value being generated from the i-th output terminal, whereby said oscillator can generate the regulated oscillator signal determined by the predetermined resistance and the total capacitance applied thereto.

Further applicability of the present invention will become apparent from the detailed description and specific examples, while preferred embodiments of the invention are given by way of illustration only, since various changes and modifications within the spirit and scope of the invention will become apparent to those skilled in the art from this detailed description.

BRIEF DESCRIPTION OF THE DRAWINGS

These and other features and advantages of the present invention may be more completely understood from the following detailed description of the preferred embodiments of the present invention with reference to the accompanying drawings in which.

DETAILED DESCRIPTION OF PREFERRED EMBODIMENTS

Now, preferred embodiments of an RC oscillator according to the present invention will be hereinafter explained in detail referring to the attached drawings.

Figure 1:
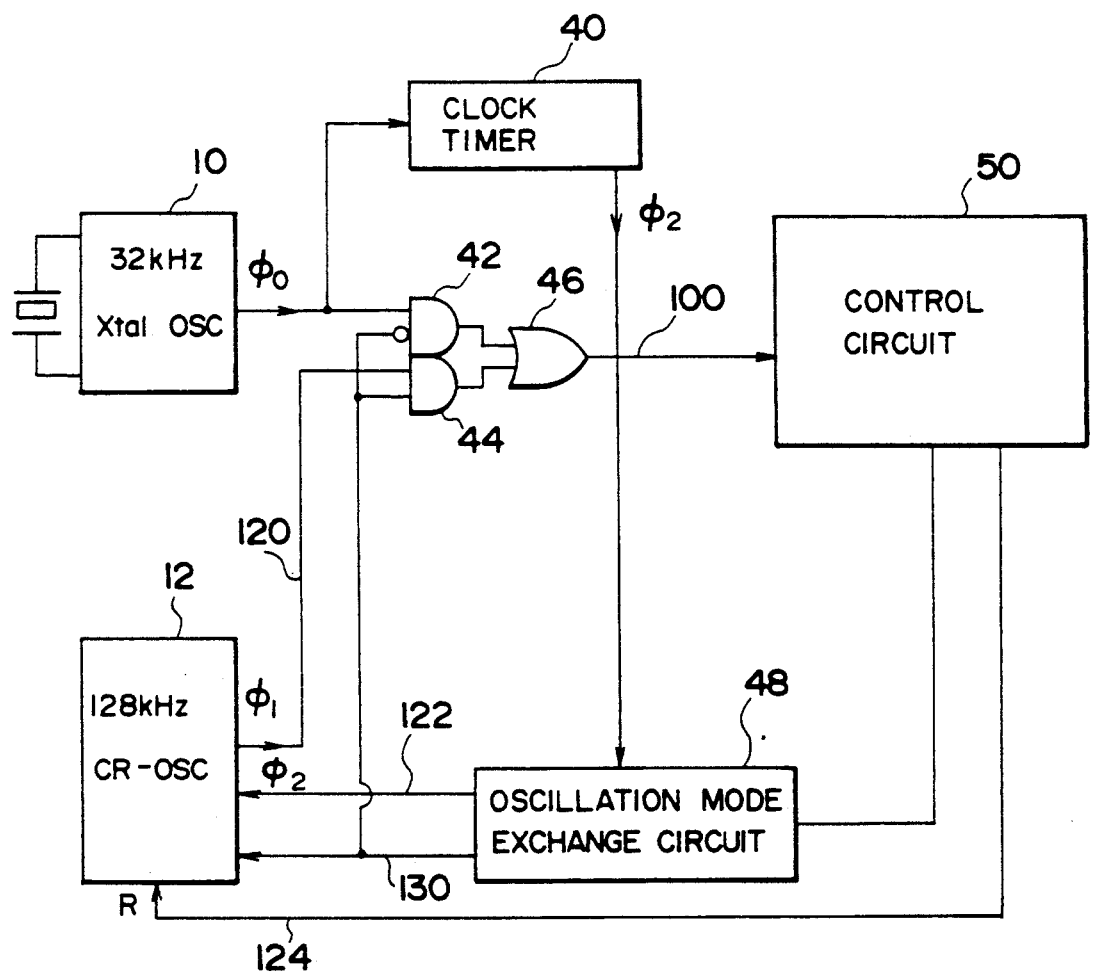
FIG. 1 is a functional block diagram illustrating one embodiment of an RC oscillator according to the present invention adapted to an integrated circuit.

FIG. 1 shows a block diagram of an integrated circuit incorporating one embodiment of an RC oscillator circuit according to the present invention. The integrated circuit is usually driven by a 32 KHz clock pulse generated by a crystal oscillator 10. In case high speed operation is required, a system clock from crystal oscillator 10 is switched by control circuit 50, explained infra, to a 128 KHz clock pulse of RC oscillator 12. It is well-known that an RC oscillator is less expensive and has a lower power requirement than a crystal oscillator used for high frequency.

Crystal oscillator 10 provides a clock pulse $\phi_0$ to a control circuit 50 in the normal operation of the system. Crystal oscillator 10 is connected to a clock timer 40 as well as a noninverted input terminal of an AND gate 42 to provide them with clock pulse $\phi_0$. Clock timer 40 generates a "count permission signal" $\phi_2$ having an accurate pulse width in accordance with clock pulse $\phi_0$ inputted from crystal oscillator 10. Clock timer 40 is connected to an oscillation mode exchange circuit 48 which outputs count permission signal $\phi_2$ to oscillator 12.

RC oscillator 12 is an oscillator having a frequency adjusting function in order to output a clock frequency with a predetermined width which outputs a high speed and high accuracy 128 KHz clock frequency. RC oscillator 12 outputs oscillation clock $\phi_1$ via line 120 to one input terminal of AND gate 44. RC oscillator 12 receives count permission signal $\phi_2$ and an activation signal from oscillation mode exchange circuit 48, and it also receives a reset signal R from a control circuit 50.

Since oscillation mode exchange circuit 48 is connected to control circuit 50, it outputs an activation signal 130 with an "H" level when changeover operation exchange from crystal oscillator 10 to RC oscillator 12 is indicated. Oscillation mode exchange circuit 48 is also connected to an inverted input terminal of AND gate 42 and to another input terminal of AND gate 44.

The output terminals of AND gates 42 and 44 are, respectively, connected to the input terminals of an OR gate 46. AND gate 42 outputs the clock of crystal oscillator 10 to the OR gate 46 when activation signal 130 is not outputted from oscillation mode exchange circuit 48. AND gate 44 outputs clock $\phi_1$ from RC oscillator 12 to the OR gate 46 when activation signal 130 is outputted. OR gate 46 is connected to control circuit 50 via signal line 100, thereby transmitting a clock as system clock 100 from either AND gate 42 or AND gate 44.

Control circuit 50 is a central processing unit activated by the clock outputted from either crystal oscillator 10 or RC oscillator 12. In case that a system clock supply source is exchanged from crystal oscillator 10 to RC oscillator 12, control circuit 50 gives oscillation mode exchange circuit 48 changeover instructions and transmits reset signal R to RC oscillator 12 via signal line 124.

Figure 2:
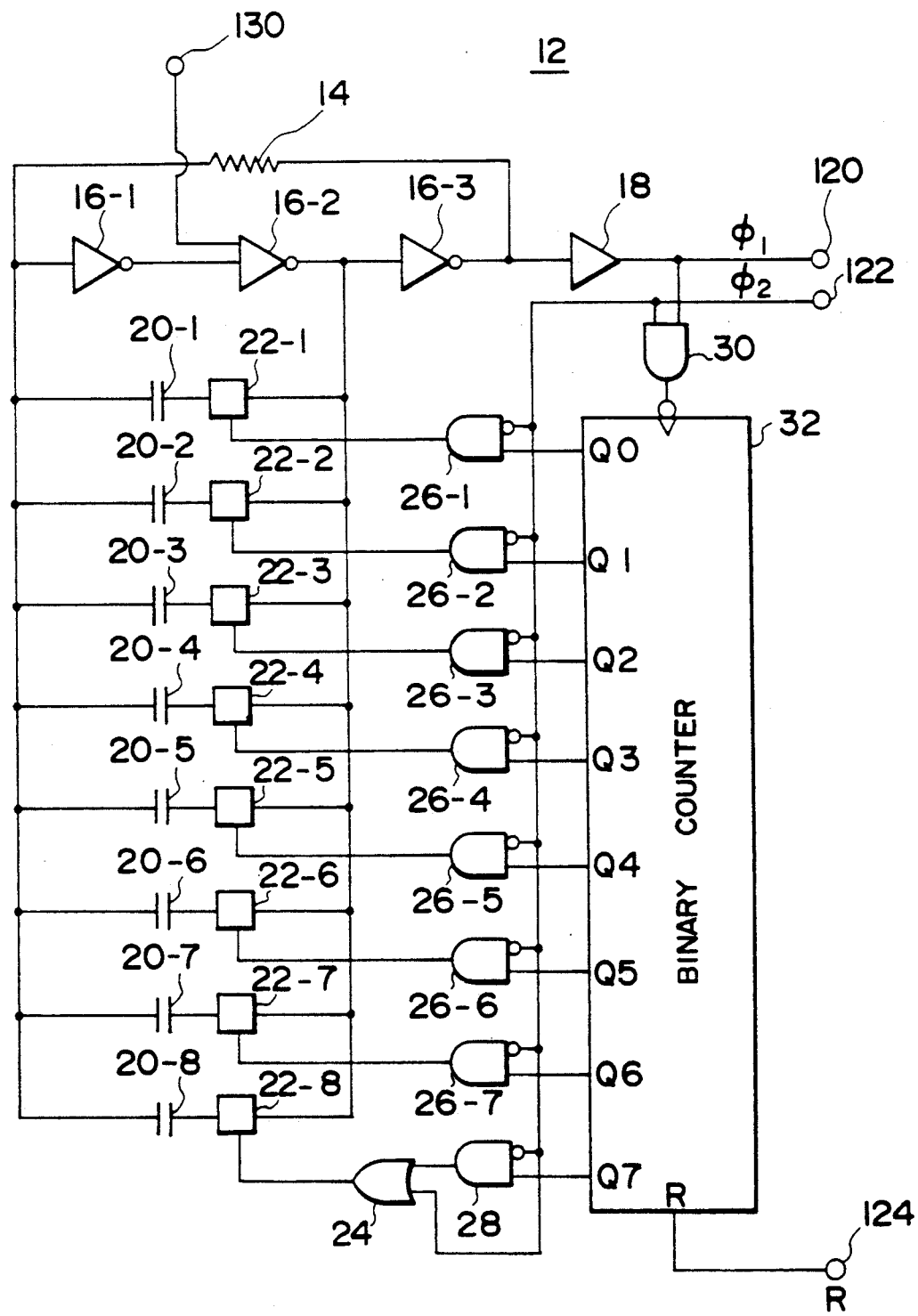
FIG. 2 is a circuit diagram illustrating one embodiment of an RC oscillator according to the present invention.

FIG. 2 shows a circuit diagram illustrating one embodiment of RC oscillator 12. Referring to FIG. 2, the RC oscillator 12 according to the present embodiment will be explained hereinafter in detail. RC oscillator 12 is an oscillator which incorporates a frequency adjustment function, comprising a resistor 14, inverters 16-1~16-3, a buffer 18, capacitors 20-1~20-8, switches 22-1~22-8, an OR gate 24, AND gates 26-1~26-7, 28, 30, and a binary counter 32.

Inverters 16-1, 16-2, 16-3 and buffer 18 are connected to each other in series. The inverter 16-2 is controlled in accordance with the activation signal 130 and comprises a NAND gate. The output terminal of inverter 16-3 is connected via resistor 14 to an input terminal of inverter 16-1. Further, capacitors 20-1~20-8, used for frequency adjusting, are connected in parallel to both inverter 16-1 and invert 16-2 via switches 22-1~22-8.

Each of capacitors 20-1~20-8 has a different capacitance value. In other words, the capacitance ratio of capacitors 20-1~20-8 is consecutively selected to become 1:2:4:8:16:32:64:128 in proportion to the weight of each bit of binary counter 32. Switch 22, which is connected to each capacitor 20, connects capacitor 20 in parallel to inverter 16 selectively.

The output terminal of buffer 18 is connected to output terminal 120 which outputs oscillation clock pulse $\phi_1$ and is also connected to one input terminal of AND gate 30. AND gate 30, the other input terminal of which is connected to input terminal 122 that transmits count permission signal $\phi_2$, outputs oscillation clock pulse $\phi_1$ inputted from buffer 18 to binary counter 32 during a period when the count permission signal $\phi_2$ is received.

Binary counter 32 is a counter which sets a bit to output terminals Q0–Q7 in response to the clock from gate 30. Binary counter 32 also resets its accumulated counting value when reset terminal 124 receives reset signal R. In other words, counter 32 maintains its output state at the output terminals Q0–Q7 until the reset signal is received. In binary counter 32, output terminal Q7 and output terminal Q0 represent a most significant bit (MSB) and a least significant bit (LSB), respectively.

Output terminals Q0–Q7 are respectively connected to non-inverted input terminals of AND gates 26-1~26-7 and 28. The inverted input terminals of AND gates 26-1~26-7 and 28 are connected to input terminal 122 which inputs the count permission signal $\phi_2$. AND gates 26-1~26-7 are respectively connected to the control terminals of switches 22-1~22-7 to control them. The output terminal of AND gate 28 is connected to one input terminal of OR gate 24. The other input terminal and the output terminal of OR gate 24 are connected to input terminal 122 inputting the count permission signal $\phi_2$ and to the control terminal of switch 22-8, respectively, whereby switch 22-8 turns on to connect capacitor 20-8 to inverter 1 when count permission signal $\phi_2$ is inputted. Switch 22 is an analog switch constituted by an integrated circuit (IC) comprising PMOS and NMOS transistors.

Referring to FIG. 1 and FIG. 2, the operation of the above mentioned embodiment will be explained hereinafter. Control circuit 50, for example, in the case that a high clock frequency operation of the system is requested, gives oscillation mode exchange circuit 48 changeover instructions for RC oscillator 12. Exchange circuit 48 outputs activation signal 130 in response to the changeover instructions to turn on the power supply of RC oscillator 12. After turning on the power supply, binary counter 32 is firstly reset by reset signal R from control circuit 50.

When count permission signal $\phi_2$ turns to an "H" level after the reset, RC oscillator 12 initiates oscillation with the frequency determined by the values of resistor 14 and capacitor 20-8, whereby counter 32 starts to count up the clock pulses of the oscillation. In this example, since binary counter 32 comprises eight (8) bits, the pulse width of count permission signal $\phi_2$ can be selected as $128 (=2^8/2) \times$ target frequency in a period with a sufficient accuracy.

AND gate 30 allows the count-up operation of binary counter 32 only when count permission signal $\phi_2$ stays at an "H" level. Further, OR gate 24 turns on switch 22-8 when the count permission signal $\phi_2$ stays at an "H" level so that capacitor 20-8 is connected between the input terminal of inverter 16-1 and the output terminal of inverter 16-2.

When the oscillation frequency reaches the predetermined target value, binary counter 32 counts 128 numbers when count permission signal $\phi_2$ stays at an "H" level. Consequently, the output bits of counter 32 become "10000000" from output Q7 (MSB) to output Q0 (LSB), respectively. Although binary counter 32 may have a counting error of $\pm 1$, the present embodiment neglects the error because the oscillation frequency defined as $f=1/(2.2CR)$ is not seriously affected.

When count permission signal $\phi_2$ reaches an "L" level, only the output level of AND gate 28 among AND gates 26-1~26-7 and 28 turns to a "1" ("H" level) hereinafter in response to the output of counter 32. Consequently, even if count permission signal $\phi_2$ turns to a "0" level ("L" level), only switch 22-8 among switchs 22-1~22-8 turns on since the output level of OR gate 24 stays at a "1" level, so that only capacitor 20-8 is connected between the input terminal of inverter 16-1 and the output terminal of inverter 16-2, whereby the oscillation with the target frequency will be performed.

When the oscillation frequency happens to be one-half of the target value, binary counter 32 counts 64 numbers when the count permission signal $\phi_2$ stays at an "H" level. In this instance, the counter output of counter 32 consequently shows "01000000" from the MSB terminal. When count permission signal $\phi_2$ turns to a "L" level, AND gate 26-7 turns to a "1" level thereafter in response to the output of counter 32, whereby switch 22-7 turns on and only capacitor 20-7 is connected between the input terminal of inverter 16-1 and the output terminal of inverter 16-2. The capacitance value of capacitor 20-7 is one-half of capacitor 20-8 as mentioned above.

The oscillation frequency f is defined as $f=1/(2.2CR)$ wherein C is the capacitance value of capacitor 20, and R is the resistance value of resistor 14. Therefore, if the capacitance value of capacitor 20 is set to be one-half, the oscillation frequency f can be double, which is equal to the target frequency.

Further, if the oscillation frequency is higher than the target frequency and the count permission signal is counted up to 250 during a period of an "H" state, the output of counter 32 shows "11111010" $(2^7+2^625+2^4+2^3+2^1=250)$ from the MSB terminal. Consequently, after count permission signal $\phi_2$ goes to an "L" level, capacitors 20-8~20-4 and 20-2 are connected in parallel between the input terminal of inverter 16-1 and the output terminal of inverter 16-2, whereby the oscillation frequency is set to be $1/250 \div 1/128$ (0.512) so that the target frequency can be achieved.

Although the pulse width of count permission signal $\phi_2$ should be accurate enough, the accurate pulse width can easily be obtained by utilizing a crystal oscillation circuit as shown in FIG. 1. Furthermore, although the oscillation frequency is adjusted in the above embodiment by varying the capacitance value of capacitor 20 which is a key element determining the frequency, it is also adjustable by varying the resistance value of resistor 14.

Figure 3:
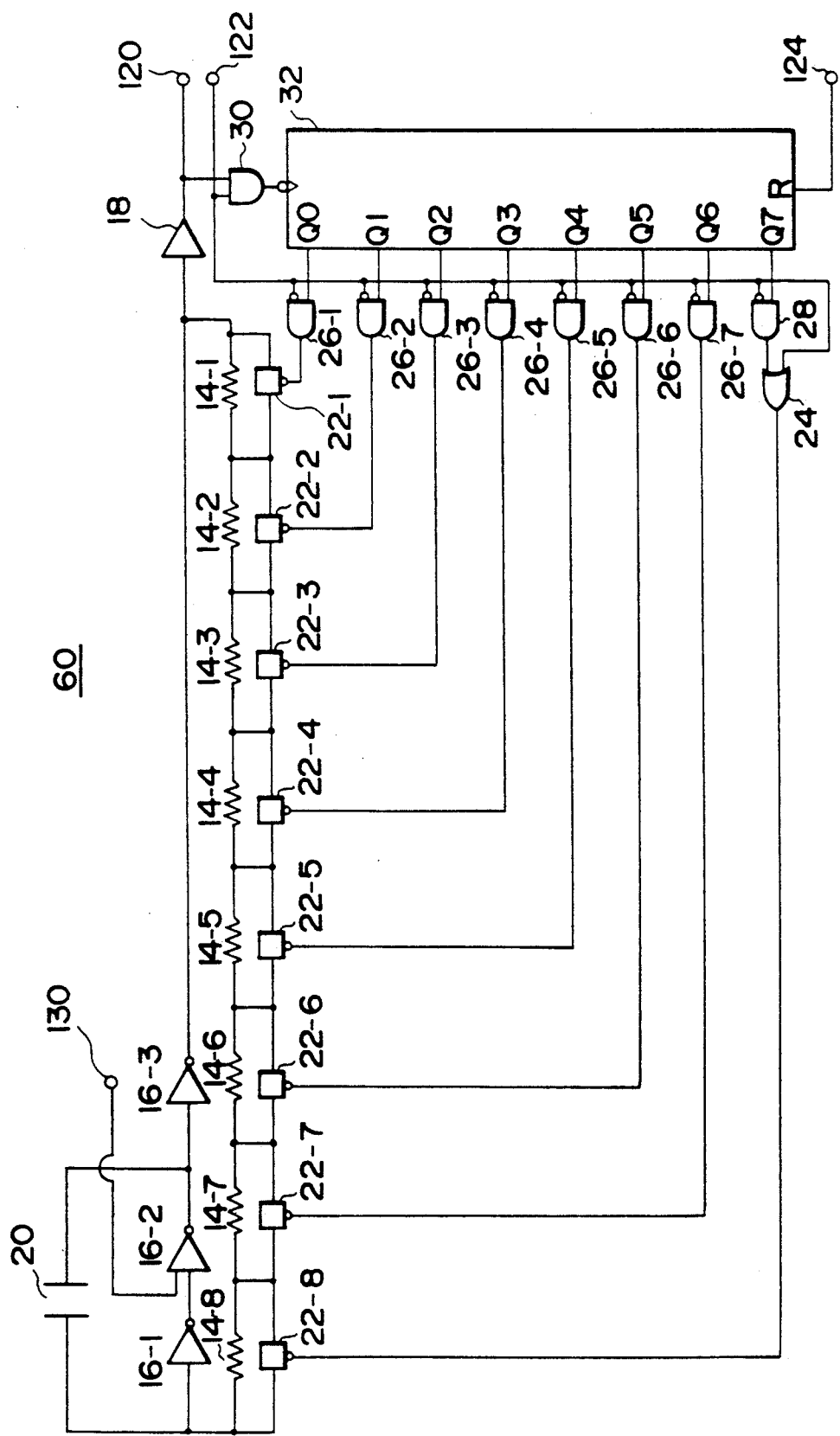
FIG. 3 is a circuit diagram illustrating another embodiment of an RC oscillator according to the present invention.

FIG. 3 shows a circuit diagram of an RC oscillator 60 illustrating another embodiment which performs frequency adjustment by varying the resistance value of resistors 14-1~14-8. As shown in FIG. 3, resistor 14, instead of capacitor 20, is connected via switch 22 to inverter 16 and switch 22 is on-off controlled in response to the counting values of binary counter 32. The resistance ratio of resistors 14-1~14-8 in RC oscillator 60 is set to the values in proportion to the weight of output bits of binary counter 32 in a similar way as the case of capacitors 20-1~20-8. There are n resistors consisting of a first resistor to an n-tn resistor. In FIG. 3, for example, there are eight such resistors. The n-th resistor has a resistance Rn, and in the case of FIG. 3, this would be the resistance of resistance 14-8. The i-th resistance Ri is determined by the equation $Ri=Rn/(2^{n-i})$. Thus, for i=n, $Ri=Rn/(2^{n-n})$ and since $2^0=1$, then Ri would equal Rn. Further applying this formula, where there are eight resistors, the eighth resistor having a resistance R8:

| value of i | value of Ri |
| --- | --- |
| 1 | $Rn/2^{8-1} = Rn/128$ |
| 2 | $Rn/2^{8-2} = Rn/64$ |
| 3 | $Rn/2^{8-3} = Rn/32$ |
| 4 | $Rn/2^{8-4} = Rn/16$ |
| 5 | $Rn/2^{8-5} = Rn/8$ |
| 6 | $Rn/2^{8-6} = Rn/4$ |
| 7 | $Rn/2^{8-7} = Rn/2$ |
| 8 | $Rn/2^{8-8} = Rn/1 = R8$ |

From this it will be confirmed that the weight of the resistors is proportional to the value of the binary counter bits, each resistor being twice as large in resistance as the preceding one. In this embodiment, resistor 14-8 is initially connected as a standard resistor to start the frequency adjustment.

Although the embodiments shown in FIG. 2 and FIG. 3 employ eight (8) capacitors or resistors, the number of capacitors and resistors is not limited to those embodiments. Further, the RC oscillator according to the present invention can be utilized in other devices or circuits such as the device operated by an RC clock, integrated circuits, etc. which require a certain accuracy in frequency.

Accordingly, the RC oscillator according to the present invention can be utilized for voiced LSIs or memory cards.

Although in the above embodiments crystal oscillator 10 is utilized to achieve an accurate pulse width of the count permission signal $\phi_2$, the following methods are interchangeably employed: (1) The count permission signal $\phi_2$ is externally inputted; (2) The counting value of the binary counter 32 is written into an EPROM (Erasable Programmable Read Only Memory) and the EPROM data are utilized as the output data of the binary counter; or (3) The count permission signal $\phi_2$ is externally supplied when an EPROM can be replaced by EEPROM (Electrically Erasable PROM).

I claim:

1. An oscillator for generating an oscillator frequency from an oscillator output terminal thereof, comprising:
   a binary counter for outputting an n-bit binary signal in response to the oscillator frequency generated from the oscillator output terminal, wherein n is a natural number, said binary counter further having n counter terminals consisting of a first counter terminal to an n-th counter terminal, an i-th terminal thereof outputting a first or second value corresponding to the i-th digit of the n-bit binary signal, wherein i is a natural number not greater than n; and
   an oscillation circuit cooperatively coupled to the binary counter, the oscillation circuit comprising
   (i) a resistor having a predetermined resistance,
   (ii) n capacitors consisting of a first capacitor to an n-th capacitor, an i-th capacitor having an i-th capacitance Ci determined by the equation $Ci = Cn/(2^{n-i})$ wherein Cn is the capacitance of the n-th capacitor, and
   (iii) n switching elements coupled to respective ones said n counter terminals consisting of a first switching element to an n-th switching element, an i-th switching element therein selectively coupling an i-th capacitor in circuit with said resistor in response to the first value being generated from the i-th counter terminal, whereby said oscillator can generate a regulated oscillator frequency from the oscillator output terminal defined by the oscillation circuit.

2. An oscillator in accordance with claim 1, wherein the first value is 1 and the second value is 0.

3. An oscillator according to claim 1 wherein the oscillation circuit is coupled to a clock input of said counter.

4. The oscillator of claim 1 wherein said binary counter includes a counter input for receiving signals to be counted, the oscillation circuit being coupled thereto,
   the oscillation circuit being configured with a first node and a second node,
   all of said capacitors and said resistor being coupled to said first node,
   each of said n switching elements being coupled to said second node so that each said switching element can selectively couple its respective capacitor to said second node,
   the oscillation circuit further comprising circuitry coupling the second node to said counter input.

5. The oscillator of claim 4 wherein said circuitry coupling the second node to the counter input is also coupled to said resistor.

6. An oscillator for generating an oscillator frequency from an oscillator output terminal thereof, comprising:
   a binary counter for outputting an n-bit binary signal in response to the oscillator frequency generated from the oscillator output terminal, wherein n is a natural number, said binary counter further having n counter terminals consisting of a first counter terminal to an n-th counter terminal, an i-th counter terminal therein outputting a first or second value corresponding to the i-th of a n-bit binary signal, wherein i is a natural number not greater than n; and
   an oscillation circuit cooperatively coupled to the binary counter, the oscillation circuit comprising
   (i) a capacitor having a predetermined capacitance,
   (ii) n resistors consisting of a first resistor to an n-th resistor, an i-th resistance Ri therein determined by the equation $Ri = Rn/(2^{n-i})$ wherein Rn is the resistance of the n-th resistor, and
   (iii) n switching elements respectively coupled to said n counter terminals consisting of a first switching element to an n-th switching element, an i-th switching element selectively coupling the i-th resistor in circuit with the capacitor in response to the first value being applied to the i-th counter terminal, whereby said oscillator can generate a regulated oscillator frequency from the oscillator output terminal defined by the oscillation circuit.

7. An oscillator in accordance with claim 6 wherein the first value is 1 and the second value is 0.

8. An oscillator according to claim 6 wherein the oscillation circuit is coupled to a clock input of said counter.

9. The oscillator of claim 6 wherein said binary counter includes a counter input for receiving signals to be counted,
   the oscillation circuit being configured with a first node and a second node,
   said capacitor being coupled to said first node,
   said n resistors being coupled in series between said first node and said second node,
   said n switching elements being coupled in series to each other, and each said switching element being coupled parallel to its corresponding resistor so that each said switching element selectively places a path of high or low conductivity in parallel with its corresponding resistor.

10. An oscillator for generating an oscillator frequency from an oscillator output terminal thereof, comprising:
    a counter circuit having first and second counter terminals, for outputting a first or second value to the first and second counter terminals in response to the oscillator frequency from the oscillator output terminal; and an oscillation circuit cooperatively coupled to the counter, the oscillation circuit comprising
  (i) a first capacitor coupled to the first counter terminal, having a first capacitance,
  (ii) a second capacitor coupled to the second counter terminal, having a second capacitance which is $2^n$ times as much as the first capacitance, wherein n is a natural number,
  (iii) a resistor having a predetermined resistance,
  (iv) a first switching element coupled between the first counter terminal and the first capacitor, selectively coupling the first capacitor in circuit with the resistor in response to the first value being generated from the first counter terminal, and
  (v) a second switching element coupled between the second counter terminal and the second capacitor, selectively coupling the second capacitor in circuit with the resistor in response to the first value being generated from the second counter terminal, whereby said oscillator can generate a regulated oscillator frequency from the oscillator output terminal defined by the oscillation circuit.

11. An oscillator in accordance with claim 10 wherein the first value is 1 and the second value is 0.

12. An oscillator in accordance with claim 10 wherein the counter circuit is a binary counter.

13. An oscillator according to claim 10 wherein the oscillation circuit is coupled to a clock input of said counter.

14. An oscillator for generating an oscillator frequency from an oscillator output terminal thereof, comprising:

a counter circuit having first and second counter terminals, for outputting a first or second value to the first and second counter terminals in response to the oscillator frequency from the oscillator output terminal;

an oscillation circuit cooperatively coupled to the counter circuit, the oscillation circuit comprising
  (i) a first resistor corresponding to the first counter terminal, the first resistor having a first resistance,
  (ii) a second resistor corresponding to the second counter terminal and having a second resistance which is $2^n$ times as much as the first resistance, wherein n is a natural number,
  (iii) a capacitor having a predetermined capacitance,
  (iv) a first switching element coupled between the first counter terminal and the first resistor, selectively coupling the first resistor in circuit with the capacitor in response to the first value being generated from the first counter terminal, and
  (v) a second switching element coupled between the second counter terminal and the second resistor, selectively coupling the second resistor in circuit with the capacitor in response to the first value being generated from the second counter terminal, whereby said oscillator can generate a regulated oscillator frequency from the oscillator output terminal defined by the oscillation circuit.

15. An oscillator in accordance with claim 14, wherein the first value is 1 and the second value is 0.

16. An oscillator in accordance with claim 14, wherein the counter circuit is a binary counter.

17. An oscillator according to claim 14 wherein the oscillation circuit is coupled to a clock input of said counter.

* * * * *